(12) United States Patent
Gresty et al.

(10) Patent No.: US 9,359,222 B2
(45) Date of Patent: *Jun. 7, 2016

(54) METHODS FOR PREPARING CU2ZNSNS4 NANOPARTICLES FOR USE IN THIN FILM PHOTOVOLTAIC CELLS

(71) Applicant: Nanoco Technologies, Ltd., Manchester (GB)

(72) Inventors: Nathalie Gresty, Cheshire (GB); Ombretta Masala, Manchester (GB); James Harris, Manchester (GB); Nigel Pickett, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/842,909

(22) Filed: Sep. 2, 2015

(65) Prior Publication Data

US 2015/0376026 A1    Dec. 31, 2015

Related U.S. Application Data

(63) Continuation of application No. 14/210,727, filed on Mar. 14, 2014.

(60) Provisional application No. 61/798,084, filed on Mar. 15, 2013.

(51) Int. Cl.
| | |
|---|---|
| *C01G 19/00* | (2006.01) |
| *H01L 31/18* | (2006.01) |
| *H01L 31/032* | (2006.01) |
| *H01L 31/0352* | (2006.01) |

(52) U.S. Cl.
CPC .......... *C01G 19/006* (2013.01); *H01L 31/0326* (2013.01); *H01L 31/035218* (2013.01); *H01L 31/1828* (2013.01); *C01P 2002/72* (2013.01); *C01P 2002/84* (2013.01); *C01P 2002/88* (2013.01)

(58) Field of Classification Search
None
See application file for complete search history.

(56) References Cited

PUBLICATIONS

Lu et al. "Wurtzite Cu2ZnSnS4 nanocrystals: a novel quaternary semiconductor", Chem. Commun., 2011, 47, p. 3141-3143.*

* cited by examiner

*Primary Examiner* — Scott B Geyer
(74) *Attorney, Agent, or Firm* — Blank Rome LLP

(57) ABSTRACT

Materials and methods for preparing $Cu_2ZnSnS_4$ (CZTS) layers for use in thin film photovoltaic (PV) cells are disclosed herein. The CZTS materials are nanoparticles prepared by a colloidal synthesis in the presence of a labile organothiol. The organothiol serves as both a sulphur source and as a capping ligand for the nanoparticles.

15 Claims, 3 Drawing Sheets

METHODS FOR PREPARING CU2ZNSNS4 NANOPARTICLES FOR USE IN THIN FILM PHOTOVOLTAIC CELLS

CROSS-REFERENCE TO RELATED APPLICATIONS

This application is a continuation of U.S. patent application Ser. No. 14/210,727 filed Mar. 14, 2014, now issued as U.S. Pat. No. 9,206,054.

FIELD OF THE INVENTION

The invention relates to materials (and processes for the preparation thereof) useful for the solution-phase fabrication of photovoltaic (PV) devices. More specifically, the disclosure describes a simple, scalable, low temperature colloidal method of synthesising $Cu_2ZnSnS_4$ nanoparticles for potential application in thin film photovoltaic devices.

BACKGROUND

In recent years, $Cu(In,Ga)Se_2$ (CIGS) materials have been extensively studied for use as an absorber layer in thin film photovoltaic devices, owing to their band gaps that can be tuned by adjusting the elemental ratios and are well matched with the solar spectrum (1.0 eV for $CuInSe_2$ to 1.7 eV for $CuGaSe_2$), offering potentially high conversion efficiencies; 20.3% conversion efficiency was achieved using $Cu(In_xGa_{1-x})Se_2$ material by researchers at ZSW and the Centre for Solar Energy and Hydrogen Research in Germany (August 2010). One drawback of CIGS materials is the high manufacturing cost, due to the high cost of the constituent elements.

$Cu_2ZnSnS_4$ (CZTS) materials can be used as a low-cost alternative to traditional $Cu(In,Ga)Se_2$, due to the abundance and low toxicity of Zn and Sn, which are much cheaper than Ga and the rarer In. CZTS is reported to have a band gap between 1.45 and 1.6eV [H. Katagiri et al., *Appl. Phys. Express*, 2008, 1, 041201; K. Ito et al., *Jpn. J. Appl. Phys.*, 1988, 27 (Part 1), 2094; T. M. Friedlmeier et al., Proc. 14th European PVSEC, Barcelona, Spain, 30 June 1997, p. 1242] and a high optical absorption coefficient (up to $10^5$ cm$^{-1}$)[G. S. Babu et al., *J. Phys. D: Appl. Phys.*, 2008, 41, 205305], which are similar to those of $CuInGaSe_2$. The current record conversion efficiency for pure $Cu_2ZnSnS_4$ of 8.4% [B. Shin et al., *Prog. Photovolt.: Res. Appl.*, 2013, 21, 72] shows great potential for this material.

The highest efficiency CZTS and CIGS solar cells are fabricated using a vacuum-based deposition method. Vacuum-based approaches typically offer high uniformity, which translates to a high quality film. However, the techniques are also generally costly, with material consumption and energy usage being high. Non-vacuum-based approaches are attractive in that they are typically higher throughput processes, with a lower deposition cost. One such method is a nanoparticle-based deposition approach. Nanoparticles of CZTS material can be fabricated, then subsequently processed into an ink or slurry, which can be printed onto a substrate using low-cost printing techniques, such as spin-coating, slit-coating, doctor blading, inkjet printing, and the like. The films are then sintered at elevated temperatures to induce growth of larger crystal grains within the film, which are necessary to achieve high power conversion efficiencies since recombination of charge carriers can occur at grain boundaries. Nanoparticles are advantageous, since they have a reduced melting point relative to the bulk material, facilitating lower temperature device processing; the smaller the nanoparticles, the lower the melting point. A uniform particle size distribution is also favourable, since particles of the same size will melt uniformly.

Nanoparticles can be synthesised from a top-down or a bottom-up approach. In a top-down approach, macroparticles are processed, e.g. using milling techniques, to form nanoparticles; the particles are typically insoluble, therefore difficult to process, and in the case of milling the size distribution may be large. Using a bottom-up approach, whereby nanoparticles are grown atom-by-atom, smaller particles with a homogeneous size distribution may be produced. Colloidal syntheses can be employed to grow nanoparticles in solution, which can be surface passivated with organic ligands to provide solubility, and thus solution processability.

The colloidal methods of making CZTS nanoparticle materials described in the prior art have one or more disadvantages. For example, the methods use hot-injection, high boiling capping agents, long reaction times, and/or unfavourable reagents for commercial processes, and/or impurity phases may be formed.

Hot-injection techniques can be used to synthesise small nanoparticles with a uniform size distribution. The technique relies on the injection of small volumes of precursors into a large volume of solvent at elevated temperature. The high temperature causes breakdown of the precursors, initiating nucleation of the nanoparticles. However, the technique results in low reaction yields per volume of solvent, thus making the reactions difficult to scale to commercial volumes.

Other prior art techniques utilise high boiling ligands, such as oleylamine. Organic ligands assist in solubilising the nanoparticles to facilitate solution processability, yet they must be removed, e.g. by evaporation, prior to sintering, since residual carbon can be detrimental to the performance of the absorber layer. Thus it is favourable that the boiling temperature of any capping ligand(s) should be substantially lower than the sintering temperature of the CZTS film.

Relatively short reaction times to produce the nanoparticles are advantageous, to minimise the total processing time from nanoparticle synthesis to functioning PV device.

In the prior art, when the CZTS nanoparticle synthesis takes place at temperatures below 180° C., an impurity phase has been observed. [T. Kameyama et al., *J. Mater. Chem.*, 2010, 20, 5319] Phase purity is preferable, in order to achieve a uniform sintering temperature and thus achieve a high quality film.

Some of the methods in the prior art utilise precursors that are unfavourable for commercial production. For example, Liu et al. describe the synthesis of $(ZnS) \times (Cu_2SnS_3)_{1-x}$ nanocrystals [Q. Liu et al., *Chem. Comm.*, 2011, 47, 964] using a dibutyldithiocarbamic acid precursor solution that is prepared using carbon disulphide. Carbon disulphide is not only highly flammable, but can also affect fertility and cause organ damage following repeated exposure; these factors have implications on the scalability of the synthesis.

Thus, there is a need for a commercially scalable synthesis of CZTS nanoparticles, utilising reagents that can be handled safely on an industrial scale, with a relatively low boiling capping agent that is suitable for lower temperature PV device processing.

SUMMARY

Materials and methods for preparing CZTS layers for use in thin film PV cells are disclosed herein. The CZTS materials are nanoparticles prepared by a colloidal synthesis. The disclosed methods are advantageous over the prior art because they are scalable for mass manufacture (kg scale) of PV materials. The scalability is due to a high yield per volume of reaction solution. The methods described herein for preparing CZTS nanoparticles are superior to hot-injection methods described in the prior art because, as described above, hot-injection is difficult to scale beyond milligram-yield production, due to the high precursor dilution conditions required.

For thin film photovoltaic applications, the organic-capped nanoparticles are dissolved or dispersed in solution, then deposited on a substrate using a printing or coating technique. Prior to sintering, the ligand must be removed by annealing within the device processing conditions to remove carbon from the film. As such, the ligand must be labile. The organothiol capping agent is easily removed at relatively low temperature (<300° C.), whereas other methods use higher boiling capping agents, which would require annealing temperatures in excess of 300° C. for their removal. As the boiling point of elemental sulphur is below 450° C., the use of high boiling ligands presents a significant risk of concomitant sulphur loss while annealing to remove the ligand during device processing. Further, the organothiol precursor has the dual function of acting as both the sulphur source and ligand, making the synthesis simple and attractive for manufacturing purposes.

Overall, the current method can be used to synthesise CZTS nanoparticle material in high yield, to provide a lower cost alternative to CIGS nanoparticle material, which can be easily processed by simple printing techniques to form an absorber layer in photovoltaic cells.

Nanoparticles, such as those described here, offer several advantages over bulk materials for thin film photovoltaic applications. Firstly, a small amount of nanoparticle material can be dissolved or dispersed in a solvent, then printed on a substrate, e.g. by spin-coating, slit-coating or doctor blading; vapour phase or evaporation techniques are far more expensive, requiring high temperatures and/or pressures. Secondly, nanoparticles are able to pack closely, facilitating their coalescence upon melting. Upon coalescence the particles can form large grains. Additionally, the melting point of nanoparticles is lower than that of the bulk material, allowing lower processing temperatures for device fabrication. Finally, the nanoparticles described herein are capped with a volatile capping agent; this assists in solubilising the particles, thus facilitating the processability of the material, yet the capping agent can easily be removed at relatively low temperature during processing to remove all carbon that can have a detrimental effect on device performance.

DESCRIPTION

As used herein, the term "CZTS" refers to $Cu_2ZnSnS_4$. As used herein, "low temperature synthesis" refers to a heating-up method of synthesis wherein the reaction solution is heated at temperatures of 300° C. or below, more particularly 250° C. or below, or 240° C. or below, to effect the conversion of the precursors to nanoparticles. In a heating-up method, the nanoparticles are combined at modest temperatures, for example, between room temperature and 200° C., and the reaction solution is subsequently heated to induce nanoparticle formation. Thus, a low temperature synthesis is different to a hot-injection synthesis because the precursors are combined at significantly lower temperatures and the concentration of the precursors in the reaction solution is significantly higher than for a hot-injection reaction. As used herein, the term "labile organothiol ligand" refers to an organothiol ligand with a boiling point less than 300° C. According to certain embodiments, greater than 50% of the ligand is removed from the nanoparticle surface when the nanoparticle is heated to 350° C.

The relatively low temperatures used in the disclosed process allow for a much safer, commercially scalable synthesis than with traditional hot-injection methods described in the prior art, which typically require large reaction volumes to yield a relatively small amount of product. Further, the synthesis avoids the use of pyrophoric materials. All of the reagents are commercially available, a key factor in influencing the cost and manufacture of the material on a large scale. The nanoparticles can be processed into thin film photovoltaic (PV) devices without the need for expensive high temperature or vacuum annealing techniques.

Thus, the process disclosed herein comprises a relatively low-temperature, safe synthesis of CZTS nanoparticles with a relatively high yield, using commercially available reagents. The material can be used as an alternative to CIGS materials as an absorber layer in thin film PV devices.

Figure 1:
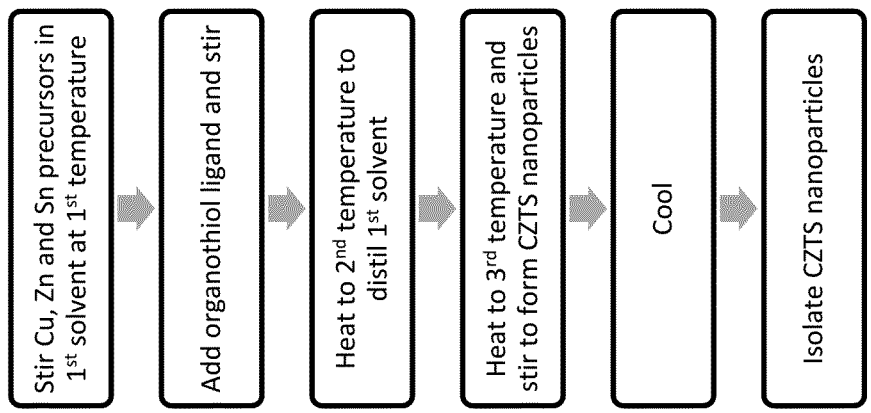
FIG. 1 is a flow diagram summarising the steps involved in the synthesis of CZTS nanoparticles.

Herein, a process for making CZTS nanoparticles is described, comprising reacting copper, zinc and tin precursors in the presence of a labile organothiol ligand. According to one embodiment, the process comprises the following steps: stirring the copper, zinc and tin precursors and the organothiol ligand in a first solvent at a first temperature to form a mixture; heating the mixture to a second temperature to distil the first solvent; heating the mixture to a third temperature for a time interval to form the CZTS nanoparticles; cooling the reaction mixture; and isolating the CZTS nanoparticles. The process is summarised in FIG. 1.

Suitable copper precursors include, but are not restricted to, an acetate, chloride, bromide, iodide or acetylacetonate. A particularly suitable copper precursor is copper (I) acetate.

The zinc precursor may include, but is not restricted to, an acetate, chloride, bromide, iodide or acetylacetonate. A particularly suitable zinc precursor is zinc (II) acetate.

The tin precursor may include, but is not restricted to, a tin (IV) chloride solution, fuming tin (IV) chloride or tin (IV) chloride pentahydrate. A particularly suitable tin precursor is tin (IV) chloride as a solution in dichloromethane, due to its relative ease and safety in handling. The dichloromethane solvent can be removed by distillation during the nanoparticle synthesis.

The organothiol compound serves both as the sulphur source and the nanoparticle capping ligand. The ligand provides dispersibility or solubility in non-polar organic solvents, allowing the nanoparticles to be processed into an ink that can be printed or coated using conventional techniques. Carbon can be detrimental to device performance, so the ligand must be sufficiently labile that it can be removed, e.g. by evaporation, at a temperature within the device processing protocol. In some embodiments it may be desirable that the boiling point of the ligand is substantially lower than that of elemental sulphur, to prevent loss of sulphur from the CZTS film while evaporating the ligand. Suitable labile organothiol ligands include, but are not restricted to, an alkanethiol, alkenethiol or aromatic thiol. In some embodiments the organothiol ligand has a boiling point in the range 190-300° C. An example of a suitable labile organothiol ligand is 1-dodecanethiol, which has a boiling point of 260° C.

In some embodiments, the first solvent, which is used to disperse the copper, zinc and tin precursors, is dichloromethane. The first temperature, at which the copper, zinc and tin precursors are stirred, must be substantially below the boiling point of the first solvent. In the case where the first solvent is dichloromethane, the first temperature may, for example, be room temperature. It will be apparent to one skilled in the art that the second temperature depends on the boiling point of the first solvent. In the case where the first solvent is dichloromethane, a suitable second temperature, or range of temperatures, lies between 50 and 55° C.

In some embodiments, the third temperature is greater than 180° C., to avoid the formation of one or more impurity phases. It is important to avoid the formation of impurity phases to achieve a homogeneous melting point, in order to grow large, phase-pure grains during sintering. In some embodiments the third temperature lies in the range 200-250° C., for example around 240° C. The time interval at which the reaction is held at the third temperature, may, for example, lie in the range 30 minutes-3 hours. For instance, the time interval may be around 60 minutes.

Once synthesised, the nanoparticles can be isolated and collected by any method known to those skilled in the art. In some embodiments, the nanoparticles are isolated via the addition of one or more organic solvents to induce flocculation, followed by centrifugation. A suitable combination of organic solvents for the isolation of organothiol-capped CZTS nanoparticles is chloroform and acetone.

Figure 2:
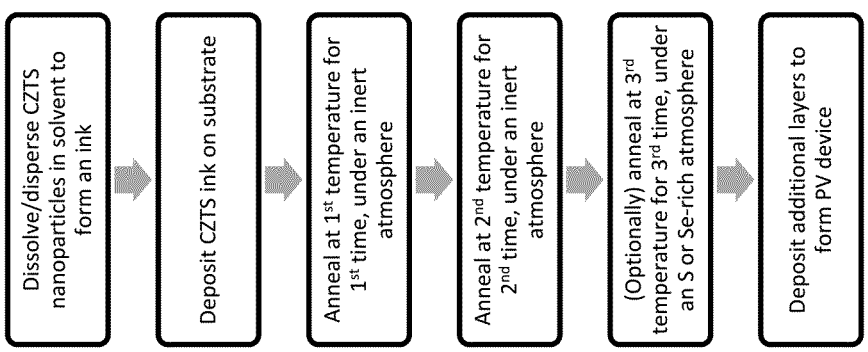
FIG. 2 is a flow diagram summarising the steps involved in the preparation of a CZTS absorber layer for a PV device from CZTS nanoparticles.

The isolated nanoparticles can be processed to form an absorber layer for a PV device. The method for processing CZTS nanoparticles to form an absorber layer for a PV device is summarised in FIG. 2. The method involves: dissolving or dispersing the CZTS nanoparticles in one or more solvents to form an ink; depositing the ink on a substrate; annealing at a first temperature, for a first time interval, under an inert atmosphere to remove the ligand; annealing at a second temperature, for a second time interval, under an inert atmosphere to induce crystallisation of the film; and optionally annealing at a third temperature, for a third time interval, under a selenium-rich and/or sulphur-rich atmosphere. Subsequent layers can then be deposited to form a photovoltaic device.

The CZTS nanoparticles can be dissolved or dispersed in one or more solvents by any method known to one skilled in the art, including shaking, stirring or ultrasonication. In some embodiments, the solvent, or solvents, are non-polar. Examples include, but are not restricted to, toluene, alkanes (e.g. hexane), chlorinated solvents e.g. (dichloromethane, chloroform, etc.), ketones (e.g. isophorone), ethers (e.g. anisole), and terpenes (e.g. α-terpinene, limonene, etc.). Optionally, other additives, such as binders, rheology modifiers, and the like, may be incorporated into the ink formulation to modify its coating properties.

The ink can be deposited on a substrate using any method known to one skilled in the art. Examples include, but are not restricted to, spin-coating, slit-coating, drop-casting, doctor blading, and inkjet printing.

Once deposited, the ink is annealed at a first temperature to remove the solvent, ligand, and other organic components of the ink formulation. This eliminates carbon residues, which can be detrimental to device performance, from the film. It will be apparent to one skilled in the art that the first annealing temperature depends on the boiling points of the organic components of the nanoparticle ink. In some embodiments, the first annealing temperature lies in the range 260-350° C., for example around 300° C. The first time interval may lie in the range 3-10 minutes, for example around 5 minutes. In some embodiments, the first annealing step is conducted under an inert atmosphere.

The films are annealed at a second temperature to induce crystallisation of the CZTS layer (sintering). In some embodiments, the second annealing temperature lies in the range 350-440° C., for example around 400° C. The second time interval may lie in the range 3-10 minutes, for example around 5 minutes. In some embodiments, the sintering step is conducted under an inert atmosphere.

The ink deposition, first and second annealing steps may be repeated until a desired film thickness is achieved.

Optionally, the films may be annealed under a sulphur-rich or selenium-rich atmosphere. Suitable sulphurisation sources include $H_2S$ and elemental sulphur. Suitable selenium sources include $H_2Se$ and elemental Se. The third annealing temperature preferably lies in the range 500-600° C., more preferably around 550° C. The third time interval preferably lies in the range 30 minutes-3 hours, most preferably around 1-2 hours.

Additional layers can be deposited on top of the CZTS layer to form a PV device.

EXAMPLES 1.00 g of Cu(ac) (8.16 mmol; ac=acetate), 0.74 g of Zn(ac)$_2$ (4.03 mmol), and 4.1 mL of a 1 M solution of $SnCl_4$ in dichloromethane (4.1 mmol) were stirred at room temperature in a 50 mL three-necked round-bottomed flask fitted with a magnetic stirrer and a condenser with a side-arm. 5 mL of dichloromethane were added to dissolve/suspend the salts, forming a grey solution. The mixture was degassed by bubbling through nitrogen at room temperature. After stirring under nitrogen for 1 ½ hours the solution had turned a beige/cream colour. 15.5 mL of 1-dodecanethiol (65.1 mmol) were injected quickly into the flask; the mixture turned instantly bright orange and the temperature rose to 34° C. The temperature was raised to 50-55° C. and held for 7 minutes to allow the dichloromethane, which collected in the side-arm of the condenser, to distil off. The temperature was then gradually raised to 240° C. in 31 minutes; the solution turned dark orange, then red, then eventually brown. Once the flask reached 240° C. the reaction mixture had formed a dark brown suspension. The temperature was held at 240° C. for 60 minutes, before cooling to room temperature. The product, a brown solid, was isolated from the black reaction slurry with chloroform and acetone. The solid was collected by centrifugation. The particles were dispersible in non-polar solvents.

Elemental analysis by inductively coupled plasma optical emission spectroscopy (ICP-OES) gave the following elemental ratios: C 13.49%; H 2.27%; Cu 27.63%; Zn 13.20%; Sn 17.97%; S 18.83%. This gives a stoichiometry of $Cu_{2.87}Zn_{1.33}Sn_{1.00}S_{3.88}$, suggesting that the material is slightly copper and zinc rich. The stoichiometry can be tuned by altering the ratios of the metal precursors.

Figure 3:
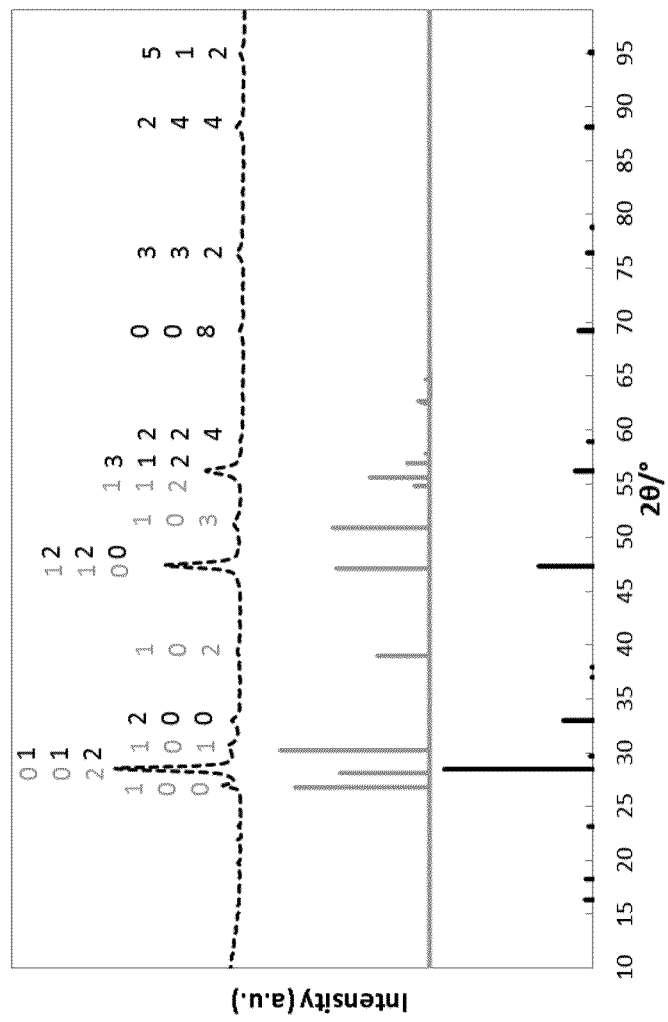
FIG. 3 shows the X-ray diffraction (XRD) pattern for the CZTS nanoparticles synthesised in the Examples.

FIG. 3 shows the X-ray diffraction (XRD) pattern for the CZTS nanoparticles (dashed line); the peak positions and intensities are well matched to those of the kesterite crystal structure of CZTS as reported in the literature [P. Bonazzi et al., *Canadian Mineral.*, 2003, 41, 639] (shown and indexed in black). Additional low intensity peaks are seen that are suggestive of a minor wurtzite phase [X. Lu et al., *Chem. Commun.*, 2011, 47, 3141] (shown and indexed in grey).

Figure 4:
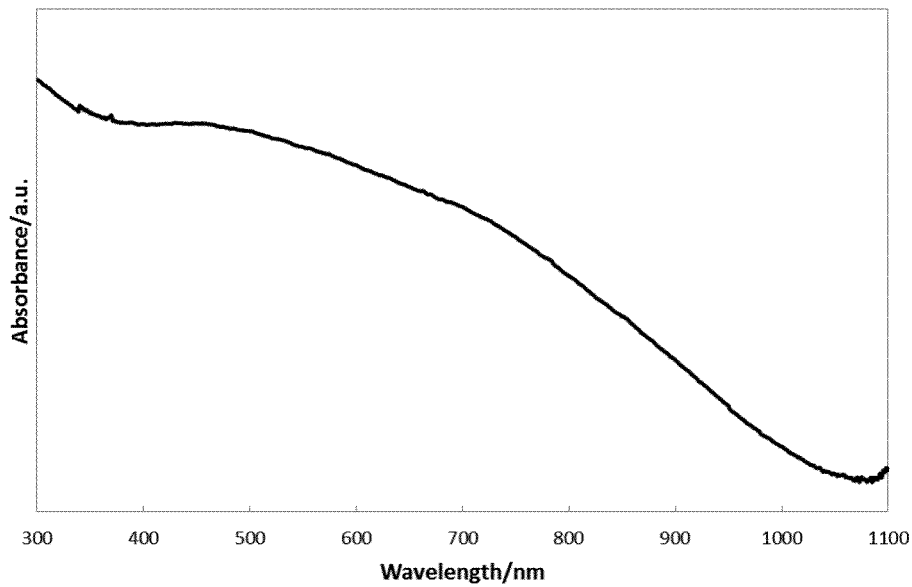
FIG. 4 shows the absorption spectrum of the CZTS nanoparticles synthesised in the Examples.

FIG. 4 shows the absorption spectrum (in toluene) of the CZTS nanoparticles. The spectrum has a broad absorbance spanning from the ultraviolet to the near-infrared region.

Figure 5:
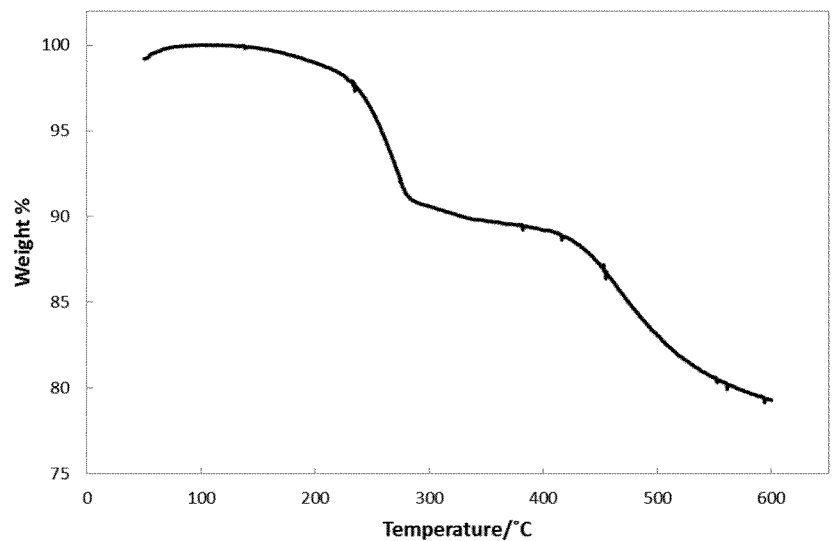
FIG. 5 shows thermogravimetric analysis (TGA) of the CZTS nanoparticles synthesised in the Examples.

FIG. 5 shows thermogravimetric analysis (TGA) of the CZTS nanoparticles synthesised in the Examples, showing two steps; the first is likely to be loss of the 1-dodecanethiol ligand capping the surface, suggesting an inorganic content of 90%. The second step is likely to result from loss of inorganic sulphur (boiling point 444.7° C.) from within the nanoparticles; this suggests that annealing temperatures of or below 400° C. are desirable for device processing to avoid the loss of sulphur from the film.

Specific compositions and methods useful for the solution-phase fabrication of photovoltaic (PV) devices have been disclosed. It should be apparent, however, to those skilled in the art that many more modifications besides those already described are possible without departing from the inventive concepts herein. The inventive subject matter, therefore, is not to be restricted by the disclosed embodiments. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A process for making $Cu_2ZnSnS_4$ nanoparticles, comprising:
    combining a copper precursor, a zinc precursor and a tin precursor in the presence of an organothiol ligand at a temperature between room temperature and about 200° C. to form a dispersion or solution; and,
    heating the dispersion or solution without dilution sufficiently to induce nanoparticle formation.

2. The process recited in claim 1, wherein the copper precursor is an acetate, chloride, bromide, iodide or acetylacetonate.

3. The process recited in claim 1, wherein the copper precursor is copper (I) acetate.

4. The process recited in claim 1, wherein the zinc precursor is an acetate, chloride, bromide, iodide or acetylacetonate.

5. The process recited in claim 1, wherein the zinc precursor is zinc (II) acetate.

6. The process recited in claim 1, wherein the tin precursor is a tin (IV) chloride solution, fuming tin (IV) chloride, tin (IV) acetate, tin (IV) bis(acetylacetonate) dichloride, triphenyl(triphenylmethyl) tin, or tin (IV) chloride pentahydrate.

7. The process recited in claim 1 where the tin precursor is tin (IV) chloride as a solution in dichloromethane.

8. The process recited in claim 1, wherein the organothiol ligand is an alkanethiol, alkenethiol or aromatic thiol.

9. The process recited in claim 1, wherein the organothiol ligand has a boiling point in the range 190-300° C.

10. The process recited in claim 1, wherein the organothiol ligand is 1-dodecanethiol.

11. The process recited in claim 1, wherein the process comprises:
    a. providing the copper precursor, the zinc precursor, the tin precursor and the organothiol ligand in a first solvent at a first temperature to form a mixture;
    b. heating the mixture to a second temperature to distill the first solvent; and,
    c. heating the mixture to a third temperature for a time interval to form the $Cu_2ZnSnS_4$ nanoparticles.

12. The process recited in claim 11, wherein the first solvent is dichloromethane.

13. The process recited in claim 11, wherein the third temperature is greater than 180° C.

14. The process recited in claim 11, wherein the third temperature is 240° C.

15. The process recited in claim 11, wherein the time interval is 60 minutes.

* * * * *